United States Patent
Wu et al.

(10) Patent No.: US 6,812,487 B1
(45) Date of Patent: Nov. 2, 2004

(54) TEST KEY AND METHOD FOR VALIDATING THE DOPING CONCENTRATION OF BURIED LAYERS WITHIN A DEEP TRENCH CAPACITORS

(75) Inventors: Tie-Jiang Wu, Ilan (TW); Chien-Chang Huang, Taipei (TW); Yu-Wei Ting, Taipei (TW); Bo-Ching Jiang, Hualien (TW); Tse-Main Kuo, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/601,417

(22) Filed: Jun. 23, 2003

(30) Foreign Application Priority Data

Aug. 21, 2002 (TW) ........................................ 91118881 A

(51) Int. Cl.$^7$ ............................ H01L 23/58; G01R 31/26
(52) U.S. Cl. ........................ 257/48; 257/301; 257/304; 257/620; 257/532; 438/14; 438/243; 438/386; 438/462
(58) Field of Search ........................ 257/48, 301, 304, 257/620, 532; 438/14, 386, 243, 462

(56) References Cited

U.S. PATENT DOCUMENTS

| | | | | | |
|---|---|---|---|---|---|
| 4,390,586 | A | * | 6/1983 | Lemelson | .................... 428/209 |
| 6,339,228 | B1 | * | 1/2002 | Iyer et al. | ...................... 257/48 |
| 2004/0017710 | A1 | * | 1/2004 | Chang et al. | ................ 365/201 |
| 2004/0033634 | A1 | * | 2/2004 | Wu et al. | ...................... 438/14 |

* cited by examiner

Primary Examiner—Mark V. Prenty
(74) Attorney, Agent, or Firm—Quintero Law Office

(57) ABSTRACT

A test key for validating the doping concentration of buried layers within a deep trench capacitor. The test key is deposited in the scribe line region of a wafer. In the test key of the present invention, the deep trench capacitor is deposited in the scribe line region and has three buried layers of three doping concentrations. An isolation region is deposited in the capacitor, and a first plug, a second and a third plug are coupled to three positions of one buried layer of the three respectively. The present invention determines whether the doping concentration of buried layers within a deep trench capacitor is valid by a first resistance measured between the first plug and the second plug and a second resistance measured between the second plug and the third plug.

8 Claims, 6 Drawing Sheets

TEST KEY AND METHOD FOR VALIDATING THE DOPING CONCENTRATION OF BURIED LAYERS WITHIN A DEEP TRENCH CAPACITORS

BACKGROUND OF THE INVENTION

1. Field of the Invention

The present invention relates to a test key and particularly to a test key and method for validating the doping concentration of buried layers within a deep trench capacitors.

2. Description of the Prior Art

Trench capacitors are frequently implemented as the essential charge storage device in a DRAM (Dynamic Random Access Memory). The trench capacitor is formed in the substrate and has a capacitance proportional to the depth of the trench. That is to say, by increasing the depth of the trench, which results in the "plates" occupying a larger surface area, the trench capacitor provides a higher capacitance.

FIG. 1 is a diagram showing the layout of a conventional DRAM. A trench capacitor 10 is disposed below the passing wordline. A transistor 14 is coupled to a node 16 of the trench capacitor 10 through a diffusion region 18. A diffusion region 20 is coupled to a plug 22. The plug 22 is coupled to a bitline (not shown). Thus, data is read from or written into the trench capacitor 10 through the node 16 by operation of the transistor 14. The transistor 14 is controlled by voltages on the wordline 12. When a high voltage level is on the wordline 12, a conductive channel is formed below the wordline 12 so that a current flows from or to the node 16 through the diffusion regions 18 and 20, whereby the data is read from or written into the capacitor 10.

FIG. 2 shows a cross section along the line AA in FIG. 1. An STI (Shallow Trench Isolation) 28 is formed in the substrate and trench capacitor to define an active area and isolate the trench capacitor 10 from the subsequently formed wordline 12. After formation of the wordline 12, the diffusion regions 18 and 20, used as a source and drain, on two sides of the wordline 12 are formed by ion implantation with masking of the wordline 12 and STI 28. The channel length L of the transistor 14 corresponds to the size of the wordline 12 and the profiles of the diffusion regions 18 and 20. Further, the profiles of the diffusion regions 18 and 20 are based on the doping concentration of the storage node 16 composed of conducting layers L13 and L12, and an electrode layer L11. Accordingly, the doping concentrations of the layers L11, L12 and L13 have great impact on the channel length L of the transistor 14. For DRAM employing trench capacitors as storage devices, an invalid doping concentration in the storage node results in current leakage adjacent memory cells or even defective cells. Validation of the doping concentration of the storage node is an essential step for DRAM manufacturing.

SUMMARY OF THE INVENTION

The object of the present invention is to provide a test key and method for validating the doping concentration of buried layers within the deep trench capacitor.

The present invention provides a test key comprising a trench capacitor deposited in the scribe line region with an electrode layer of a first doping concentration, a first conducting layer with a second doping concentration and a second conducting layer with a third doping concentration, an isolation region deposited in the trench capacitor, penetrating the second conducting layer and extending into the first conducting layer so that the second conducting layer is divided into a first and second portion, a first plug coupled to a first side of the first portion of the second conducting layer, a second plug coupled to a second side of the first portion of the second conducting layer, and a third plug coupled to the second portion of the second conducting layer.

The present invention further provides a validation method comprising the steps of providing a wafer having at least one scribe line region and a memory cell region, forming a test key in the scribe line region and a plurality of memory cells in the memory cell region, wherein the test key comprises a trench capacitor deposited in the scribe line region with an electrode layer of a first doping concentration, a first conducting layer with a second doping concentration and a second conducting layer with a third doping concentration, an isolation region deposited in the trench capacitor, penetrating the second conducting layer and extending into the first conducting layer so that the second conducting layer is divided into a first and second portion, a first plug coupled to a first side of the first portion of the second conducting layer, a second plug coupled to a second side of the first portion of the second conducting layer, and a third plug coupled to the second portion of the second conducting layer, measuring a first resistance between the first and second plug, measuring a second resistance between the second and third plug, and validating the first, second and third doping concentrations by the first and second resistance.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 3:
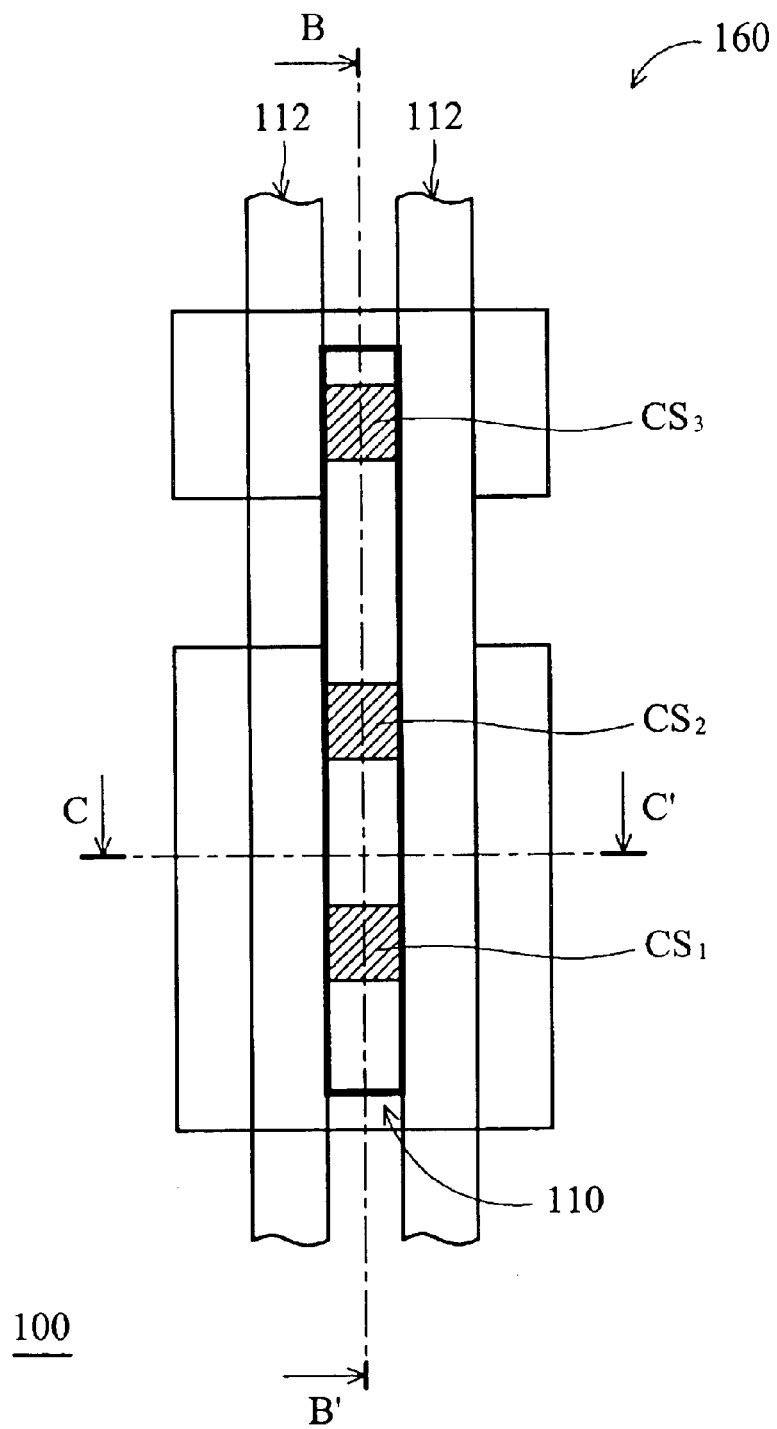
FIG. 3 shows the layout of a test key to validate the doping concentration of buried layers within a deep trench capacitor according to one embodiment of the invention.
Figure 4:
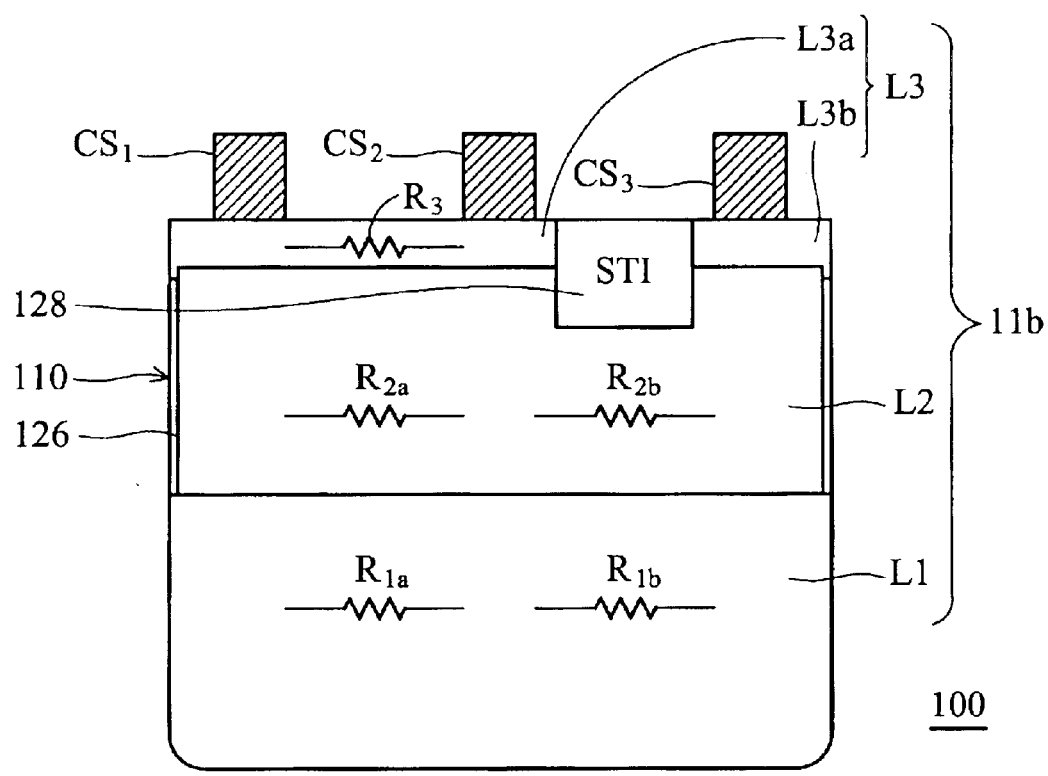
FIG. 4 shows a cross section along the line BB' in FIG. 3.
Figure 5:
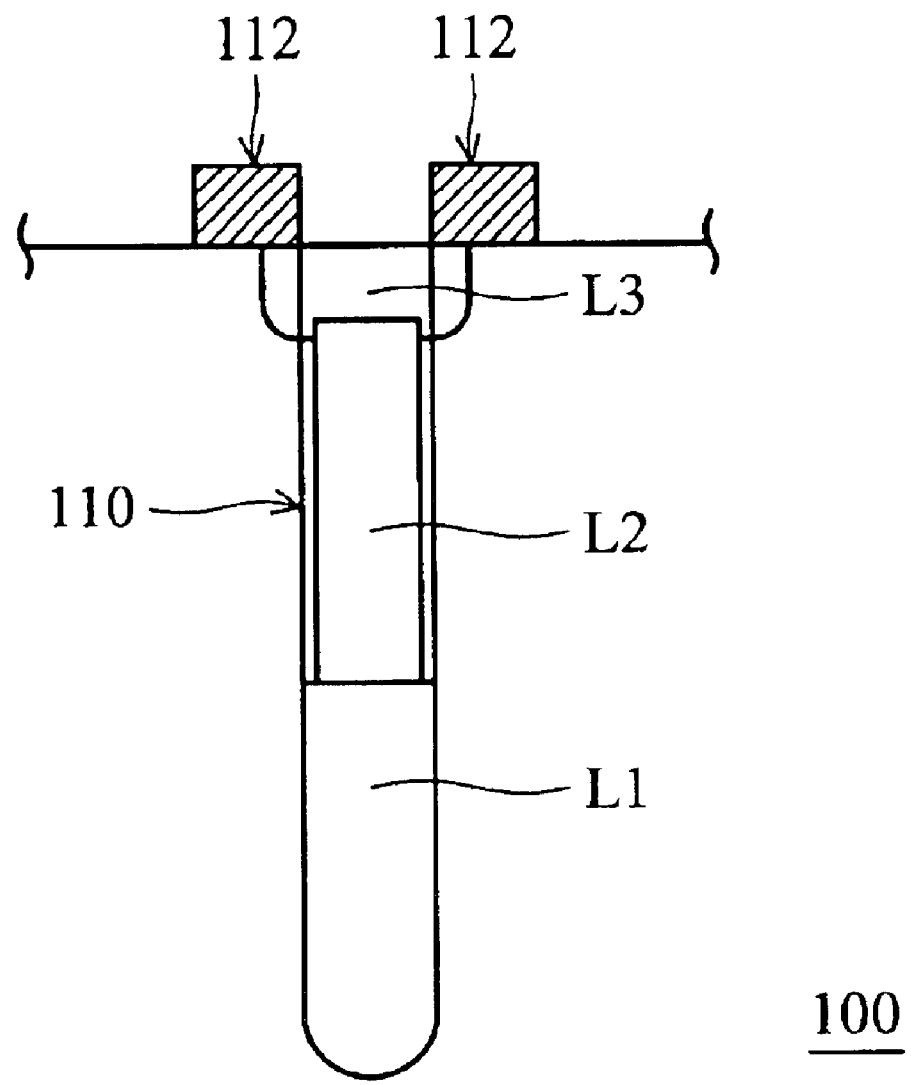
FIG. 5 shows a cross section along the line CC' in FIG. 3.

FIG. 3 shows the layout of a test key to validate the doping concentration of buried layers within a deep trench capacitor according to one embodiment of the invention. FIGS. 4 and 5 show cross sections along the line BB' and CC' in FIG. 3.

A trench capacitor 110 is formed in the scribe line region 160 of a wafer 100. The trench capacitor 110 includes a storage node 11b composed of an electrode layer L1 and conducting layers L2 and L3. The layers L1, L2 and L3 may be composed of poly-silicon. The doping concentrations of the layers L1, L2, and L3 may result in a surface resistance of 250Ω, 350Ω, and 600Ω respectively.

An isolation layer 128 is formed in the trench capacitor 110 by shallow trench isolation, which penetrates the conducting layer L3 and extends into the conducting layer L2. The conducting layer L3 is thus divided into two portions L3a and L3b.

Plugs CS1, CS2 and CS3 are formed, which are coupled to the conducting layer L3 respectively on one side of the portion L3a, the other side of the portion L3a and one side of the portion L3b.

Two passing wordlines 12 are formed above the trench capacitor 110.

Figure 6A:
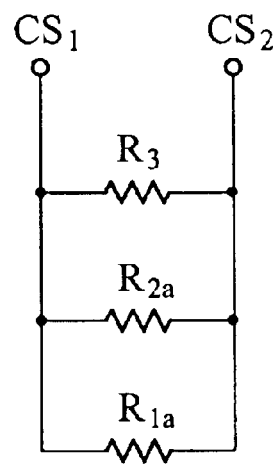
FIGS. 6a and 6b are diagrams showing equivalent circuits of different parts of a test key according to one embodiment of the invention.
Figure 6B:
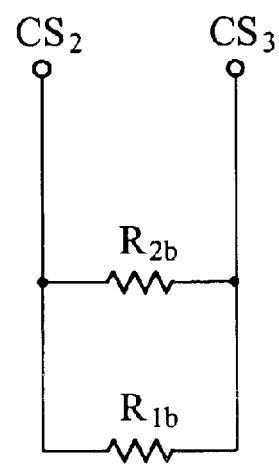

By using the test key, the resistances between the plugs CS1 and CS2, and CS2 and CS3 are measured to validate the doping concentrations. FIG. 6a shows an equivalent circuit between the plugs CS1 and CS2. The total resistance RT1 between the plugs CS1 and CS2 results from the parallely connected resistors R3, R2a and R1a. FIG. 6b shows an equivalent circuit between the plugs CS2 and CS3. The total resistance RT2 between the plugs CS2 and CS3 results from the parallely connected resistors R2b and R1b.

If the doping concentrations of the layers L1, L2, and L3 are valid, the resistance RT1 has a predetermined value of about 290Ω while the resistance RT2 has a predetermined value of about of and 310Ω. On the contrary, if the doping concentration of the layer L3 is too heavy, the measured resistance RT1 is lower than 290Ω while the resistance RT2 remains around 310Ω, or if the doping concentration of the layer L2 is too heavy, both measured resistances RT1 and RT2 are lower than their predetermined values. Thus, doping concentrations of the layers L1, L2 and L3 can be validated by measuring the resistances RT1 and RT2 between the plugs CS1 and CS2, and CS2 and CS3.

The method for validating the doping concentration of buried layers within a deep trench capacitor according to one embodiment of the invention is described in the following.

First, a wafer having at least one scribe line region and a memory cell region is provided.

Figure 1:
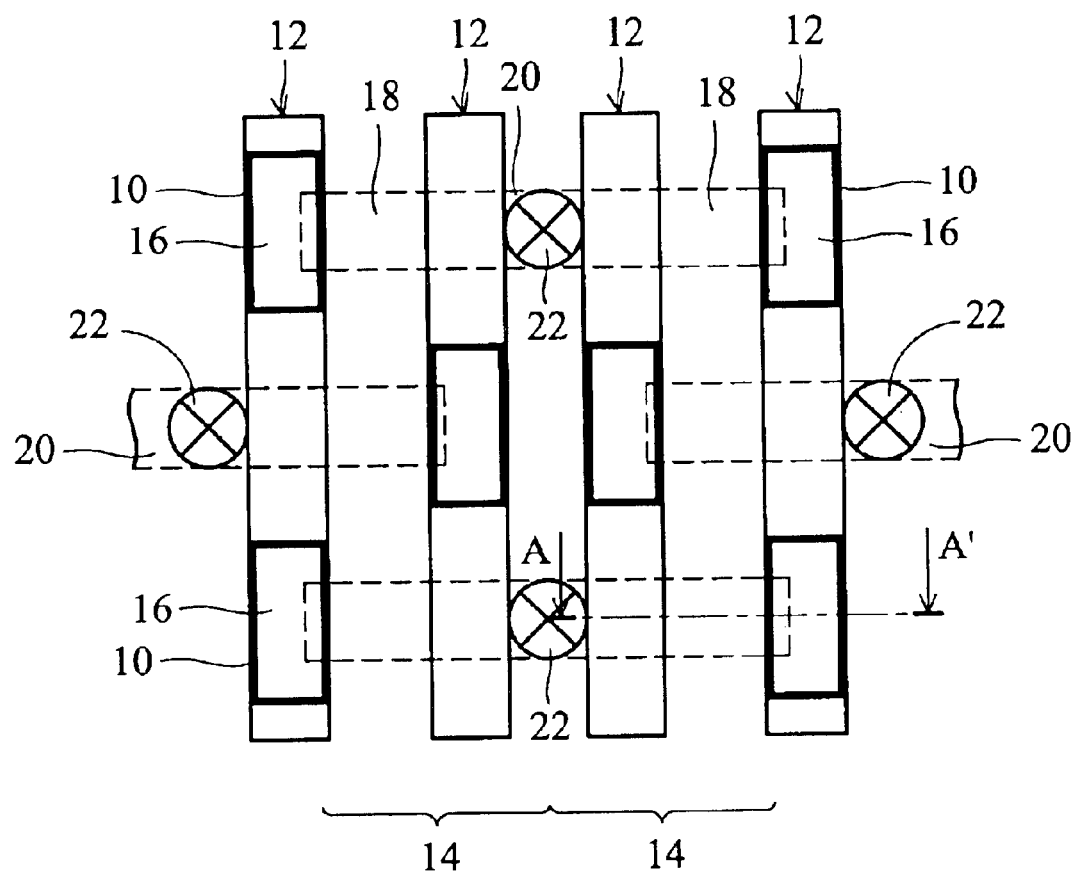
FIG. 1 shows the layout of a conventional DRAM.
Figure 2:
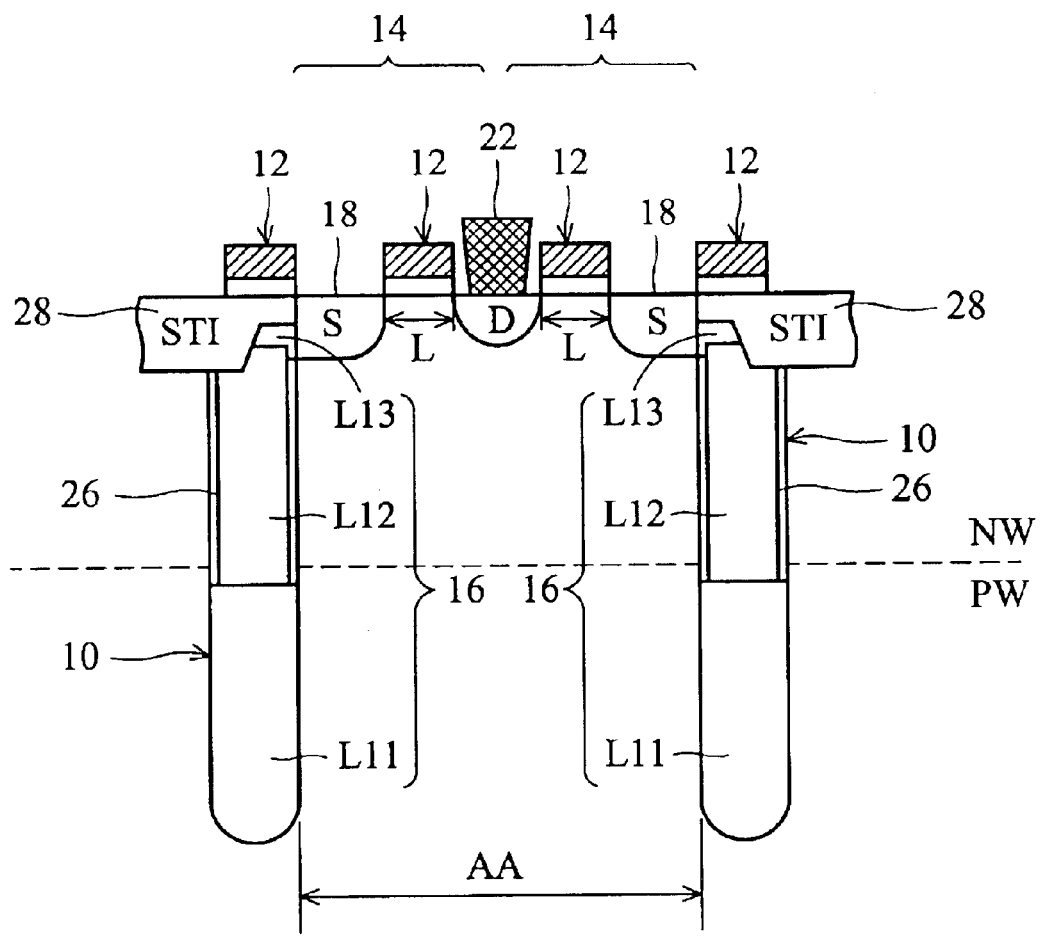
FIG. 2 shows a cross section along the line AA in FIG. 1.

Second, a test key, as shown in FIG. 3, is formed in the scribe line region and a plurality of memory cells, as shown in FIGS. 1 and 2 are formed in the memory cell region.

Third, measuring a first resistance RT1 between the plugs CS1 and CS2, and a second resistance RT2 between the plugs CS2 and CS3.

Finally, the doping concentration of the layers L1, L2, and L3 are validated by the first and second resistances RT1 and RT2. If the doping concentrations of the layers are valid, each resistance level RT1 and RT2 near a predetermined value. On the contrary, if the doping concentration of the layer L3 is too heavy, the measured resistance RT1 is lower than the predetermined value, or if the doping concentration of the layer L2 is too heavy, both measured resistances RT1 and RT2 are lower than their predetermined values. Thus, the doping concentration of the layers L1, L2, and L3 can be validated by measuring the resistances RT1 and RT2 between the plugs CS1 and CS2, and CS2 and CS3.

Since there is no difference between the doping concentration of two corresponding doping regions respectively in the scribe line and memory cell region, validation of the doping concentrations of the layers L1, L2 and L3 of the deep trench capacitors used in the memory cells can be also implemented by measurement of the resistances RT1 and RT2.

In conclusion, the present invention provides a test key and method for validating the doping concentration of buried layers within a deep trench capacitor. By insertion of an isolation region, the buried layers are divided into portions. The validity of the doping concentrations of the buried layers is determined by measuring the resistances between the portions. The inventive method provides rapid doping concentration validation for trench capacitors used in DRAM. Furthermore the test key disposed in the scribe line region of the wafer does not require any space in the memory cell.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A test key for validating the doping concentration of buried layers within a deep trench capacitor, which is deposited in the scribe line region of a wafer, the test key comprising:

a trench capacitor deposited in the scribe line region with an electrode layer of a first doping concentration, a first conducting layer of a second doping concentration and a second conducting layer of a third doping concentration;

an isolation region deposited in the trench capacitor, penetrating the second conducting layer, and extending into the first conducting layer so that the second conducting layer is divided into a first and second portion;

a first plug coupled to a first side of the first portion of the second conducting layer;

a second plug coupled to a second side of the first portion of the second conducting layer; and a third plug coupled to the second portion of the second conducting layer.

2. The test key as claimed in claim 1 further comprising a first and second passing word line disposed above the trench capacitor.

3. The test key as claimed in claim 1, wherein the second doping concentration is determined as invalid if a resistance between the first and second plug is measured as lower than a predetermined value.

4. The test key as claimed in claim 1, wherein the third doping concentration is determined as invalid if a first resistance between the first and second plug is measured as lower than a first predetermined value, and a second resistance between the second and third plug is measured as lower than a second predetermined value.

5. A method for validating the doping concentration of buried layers within a deep trench capacitor, comprising the steps of:

providing a wafer having at least one scribe line region and a memory cell region;

forming a test key in the scribe line region and a plurality of memory cells in the memory cell region, wherein the test key comprises:

a trench capacitor deposited in the scribe line region with an electrode layer of a first doping concentration, a first conducting layer of a second doping concentration and a second conducting layer of a third doping concentration;

an isolation region deposited in the trench capacitor, penetrating the second conducting layer, and extending into the first conducting layer so that the second conducting layer is divided into a first and second portion;

a first plug coupled to a first side of the first portion of the second conducting layer;

a second plug coupled to a second side of the first portion of the second conducting layer; and a third plug coupled to the second portion of the second conducting layer;

measuring a first resistance between the first and second plug;

measuring a second resistance between the second and third plug; and validating the first, second and third doping concentrations by the first and second resistance.

6. The method as claimed in claim 5, wherein the test key further comprises a first and second passing word line disposed above the trench capacitor.

7. The method as claimed in claim 5, wherein the second doping concentration is determined as invalid if a resistance between the first and second plug is measured as lower than a predetermined value.

8. The method as claimed in claim 5, wherein the third doping concentration is determined as invalid if a first resistance between the first and second plug is measured as lower than a first predetermined value, and a second resistance between the second and third plug is measured as lower than a second predetermined value.

* * * * *